Figure 1A:
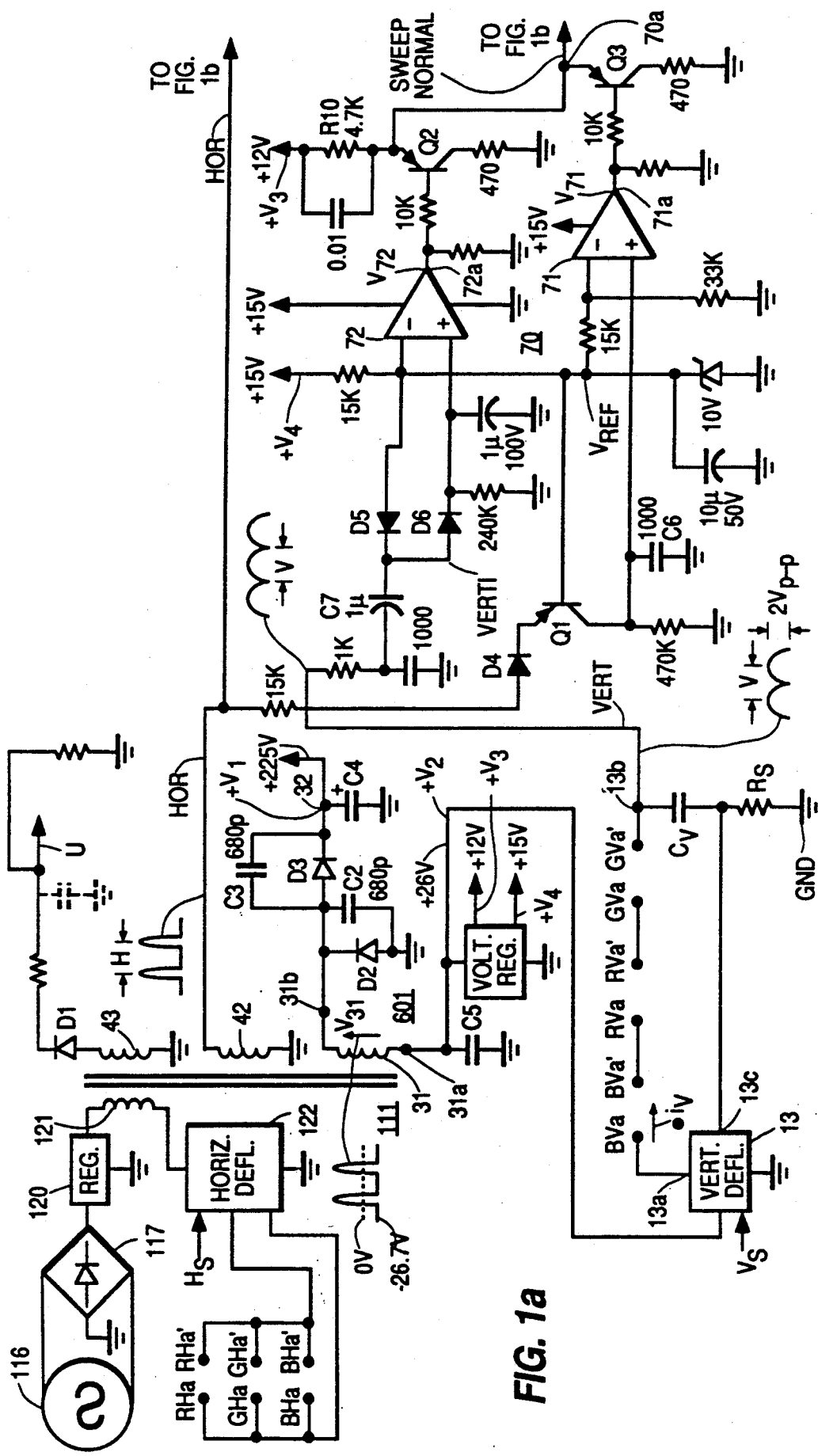

United States Patent [19]

Wignot et al.

[11] Patent Number: 5,034,665
[45] Date of Patent: Jul. 23, 1991

[54] DEFLECTION LOSS PROTECTION ARRANGEMENT FOR A CRT

[75] Inventors: Leroy S. Wignot; Lawrence E. Smith, both of Indianapolis, Ind.

[73] Assignee: Thomson Consumer Electronics, Inc., Indianapolis, Ind.

[21] Appl. No.: 515,499

[22] Filed: Apr. 30, 1990

[51] Int. Cl.$^5$ .......................... G09G 1/04; H04N 5/30
[52] U.S. Cl. .................... 315/386; 358/220
[58] Field of Search ................ 315/381, 384, 386; 358/60, 220, 243

[56] References Cited

U.S. PATENT DOCUMENTS

| | | | |
|---|---|---|---|
| 3,810,024 | 5/1974 | Meacham | 328/8 |
| 3,963,961 | 6/1976 | Ray et al. | 315/381 |
| 4,198,661 | 4/1980 | Gatten et al. | 358/242 |
| 4,297,619 | 10/1981 | Kiteley | 315/381 |
| 4,340,910 | 7/1982 | Valdes | 358/243 |
| 4,390,817 | 6/1983 | Johnson | 315/384 |
| 4,404,500 | 9/1983 | Stow | 315/386 |
| 4,488,181 | 12/1984 | Haferl | 358/220 |
| 4,521,720 | 6/1985 | Griffey | 315/386 |
| 4,642,532 | 2/1987 | Hoover | 315/386 |
| 4,660,093 | 4/1987 | Craig | 358/243 |
| 4,677,351 | 6/1987 | Brust et al. | 315/386 |
| 4,763,046 | 8/1988 | Sheikholeslami et al. | 315/381 |

OTHER PUBLICATIONS

Pp. 1 and 2 of schematic diagram entitled Rear Projection CRT Board, dated 3/25/88 and 1/12/89.
U.S. patent application Ser. No. 07/516,386 entitled a Self Biasing Protection Arrangement for a Cathode Ray Tube, in the name of John Barrett George.
U.S. patent application Ser No. 07/515,513 entitled A Protection Circuit for a Cathode Ray Tube, in the name of John Barrett George.
Schematic diagram for PV-140/Digital (G) Zenith Rear Proj. Color Digital TV Receiver, reprinted in Profax, May 1990.
U.S. patent application Ser. No. 07/516,385 entitled Projection TV Deflection Loss Protection Circuit, in the names of Marvin Neil Norman, Lawrence Edward Smith & Peter Ronald Knight.
U.S. patent application Ser. No. 07/515,512 entitled Video Display Apparatus With Kinescope Spot Burn Protection Circuit, in the names of Thomas David Gurley and Leroy Samuel Wignot.

Primary Examiner—Gregory C. Issing
Attorney, Agent, or Firm—Joseph S. Tripoli; Joseph J. Laks; Sammy S. Henig

[57] ABSTRACT

Three vertical deflection windings of corresponding three deflection yokes that are mounted on three cathode ray tubes of a projection video are coupled in series through corresponding three connector pairs. Three horizontal deflection windings of the corresponding three deflection yokes are coupled in parallel through the corresponding three connector pairs. When any of the three connector pairs is left disengaged, a disabling signal that is indicative of a loss of a vertical deflection current in the series coupled vertical deflection windings is generated. The disabling signal is coupled to a corresponding video driver of each of the cathode ray tubes for providing beam current blanking to protect the screens of the tubes against a screen burn damage.

3 Claims, 2 Drawing Sheets

DEFLECTION LOSS PROTECTION ARRANGEMENT FOR A CRT

This invention relates to a protection circuit for a cathode ray tube (CRT).

Projection video display apparatus, such as television receivers, normally include three monochrome cathode ray tubes individualy producing red green and blue images. A magnifying lens assembly is mounted to each of the cathode ray tubes and causes light from the tubes to be reflected from one or more mirrors onto the area of a projection screen, for rear projection-type receivers. The screen transmits some of the light so that an enlarged image formed from the superimposed images from each of the cathode ray tubes is viewable from a position in front of the screen. The screen acts to diffuse the light from the tubes somewhat to increase the audience viewing angle in order to enlarge the acceptable viewing region about the front of the screen.

In order to form a final enlarged image of sufficient brightness that viewing is acceptable under normal room lighting, it is necessary that the individual cathode ray tube be operated at high brightness levels, corresponding to high levels of electron beam current density. Loss or reduction of horizontal or vertical deflection or scan of any of all of the cathode ray tube electron beams will cause an undesirable concentration of electron beam energy over a small region of the phosphor display screen of one or more of the cathode ray tubes. This may cause permanent damage to the display screen if the scan loss or reduction condition persists for even a short time.

A horizontal deflection circuit output stage, for example, may be coupled to each horizontal deflection winding in each CRT via a corresponding connector pair that is engaged during normal operation. For television receiver service purposes, a service technician may disconnect the horizontal deflection circuit output stage from the corresponding deflection winding by disengaging the connector pair. Should the service technician, for example, inadvertently turn on the television receiver while such a connector pair is still disengaged, a screen burn damage may occur because of the deflection loss, as explained before. It may be desirable to detect the loss of, for example, horizontal deflection in any of the yokes that occurs as a result of the aforementioned disengaged connector pair and to disable or blank the beam current to prevent the aforementioned screen burn damage.

A video display apparatus, embodying an aspect of the invention, includes a first cathode ray tube having a first deflection yoke mounted thereon that includes a first horizontal deflection winding and a first vertical deflection winding. A second cathode ray tube has a second deflection yoke mounted thereon that includes a second horizontal deflection winding and a second vertical deflection winding such that, in normal operation, the vertical deflection windings are coupled in series to form a current path that includes the vertical deflection windings. A horizontal deflection circuit output stage generates a corresponding horizontal deflection current in each of the horizontal deflection windings in normal operation. A vertical deflection circuit output stage generates a vertical deflection current in the current path in normal operation. A first connector of a connector pair has a pair of terminals that are coupled to the first vertical deflection winding and to the first horizontal deflection winding, respectively. A second connector of the connector pair has a pair of terminals that are coupled to the horizontal and to the vertical deflection circuit output stages, respectively. When the connector pair is engaged, the horizontal deflection current flows in the first horizontal deflection winding and the vertical deflection current flows in the first vertical deflection winding. When the connector pair is disengaged, each of the horizontal and vertical deflection currents in the first horizontal deflection winding and in the vertical deflection winding, respectively, are not generated. A control signal is generated when the vertical deflection current is not generated such that the control signal is indicative of the connector pair being disengaged. The control signal is coupled to at least one of the cathode ray tubes for blanking a beam current in at least one of the cathode ray tubes when the control signal is generated for providing fault protection.

Figure 1B:
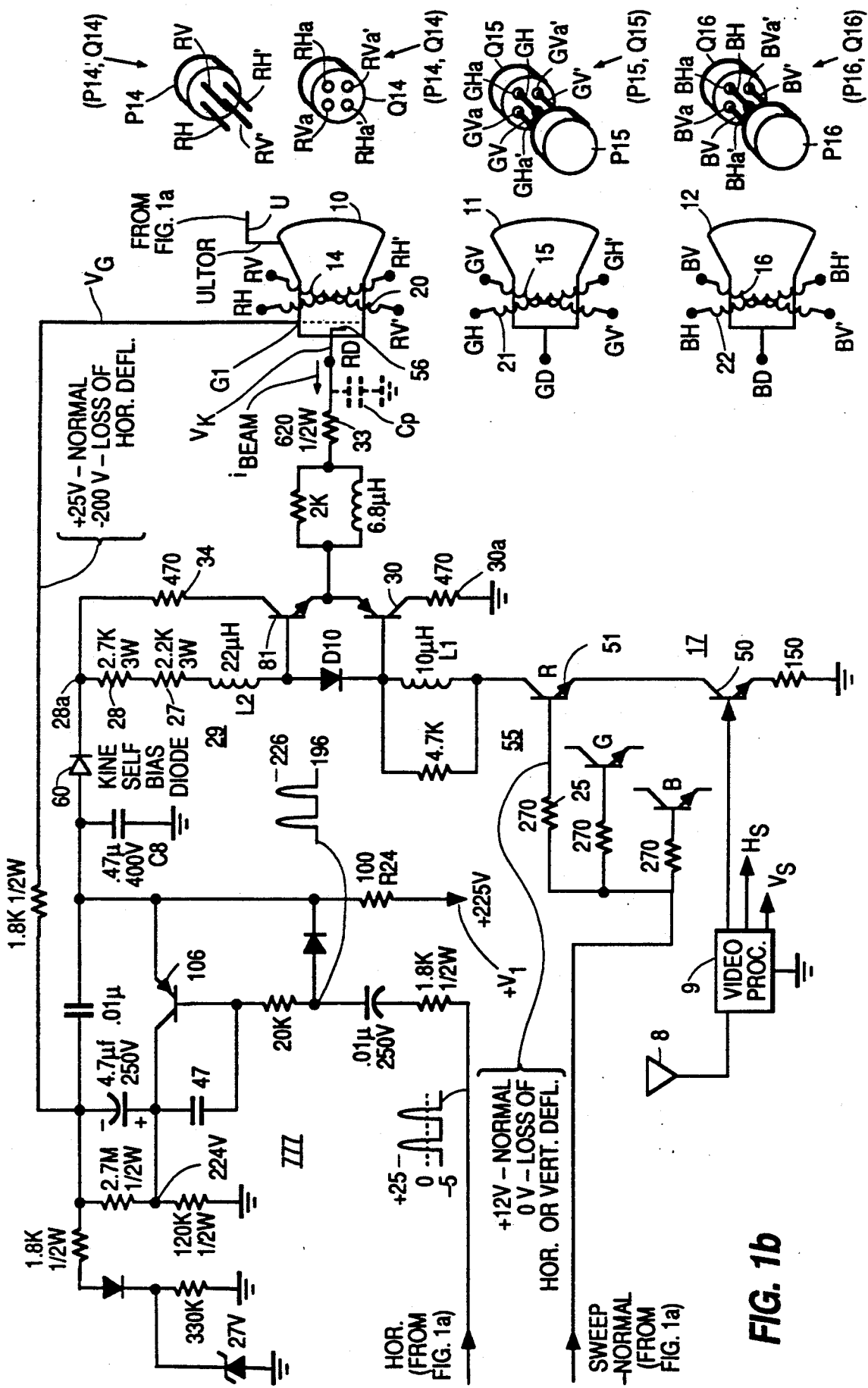

FIGS. 1A and 1B illustrate a block and schematic diagram of a portion of a projection-type video display apparatus incorporating a protection arrangement, embodying an aspect of the invention, for a CRT.

Referring to the FIGS. 1A and 1B, a projection-type video display apparatus, such as a television receiver, incorporates three monochrome kinescopes 10, 11 and 12. Kinescope or CRT 10 illustratively produces red images, kinescope 11 produces green images, and kinescope 12 produces blue images.

Vertical deflection windings 14, 15 and 16 are coupled between terminals RV—RV', GV—GV' and BV—BV', respectively, of connectors P14, P15 and P16, respectively. Connectors Q14, Q15 and Q16 form corresponding connector pairs (P14, Q14), (P15, Q15) and (P16, Q16) that are engaged to provide normal operation. When connector pair (P14, Q14), for example, is engaged, vertical deflection winding 14 is coupled between terminals RVa—RVa' of connector Q14. When all the connector pairs are engaged, vertical deflection windings 14, 15 and 16 are coupled in series between the output terminal 13a of a vertical deflection circuit 13 and a terminal 13b.

A DC blocking capacitor $C_V$ and a current sampling resistor $R_S$ are coupled in series with windings 14, 15 and 16, between terminal 13a and a ground conductor. Circuit 13 produces a sawtooth vertical deflection current $i_v$ that flows in capacitor $C_V$ to produce, during normal operation, a vertical rate signal VERT at terminal 13b that is mainly a parabolic voltage. Should a vertical scan loss occur, for example, when any one of connector pairs (P14, Q14), (P15, Q15) and (P16, Q16) is disengaged, parabolic signal VERT will not be generated. For illustration purposes, FIG. 1B shows connector pair (P14, Q14) disengaged and the other two connector pairs engaged.

Horizontal deflection windings 20, 21 and 22 are coupled between terminals RH—RH', GH–CH' and BH–BH', respectively, of connectors P14, P15 and P16, respectively. As indicated before, connectors Q14, Q15 and Q16 are designed to engage or mate with connectors P14, P15 and P16, respectively, when assembled for normal operation. When connector pair (P14, Q14), for example, is engaged, horizontal deflection winding 20 is coupled between terminals RHa—RHa' of connector Q14. When all the connector pairs are engaged, horizontal deflection windings 20, 21 and 22 are coupled in parallel and to a horizontal deflection circuit 122.

Horizontal deflection circuit 122 is coupled to a primary winding 121 of a flyback or high voltage transformer 111. Winding 121 is energized from a regulator 120 that is energized by a mains supply voltage 116. High voltage transformer 111 includes a load circuit supply winding 31 which, via a diode D3 of a rectifying stage 601, produces a voltage level $+V_1$ at a terminal 32. A nominal level of voltage level $+V_1$ is $+225$ volts. Voltage level $+V_1$ is DC-coupled to the cathodes of CRT's 10, 11 and 12, as described later on.

During the trace interval of a deflection cycle, a trace voltage $V_{31}$ is developed across winding 31 of flyback transformer 111, in a well known manner. Trace voltage $V_{31}$ is, for example, $+26.7$ volts. A diode D2 that is poled to be conductive during trace is coupled between a terminal 31b of winding 31 and a ground or common conductor GND. Diode D2 couples trace voltage $V_{31}$ across a filter capacitor C5 for developing a positive voltage level $+V_2$ across capacitor C5 at a terminal 31a of winding 31 to energize vertical deflection circuit 13. Voltage level $+V_2$ is approximately $+26$ volts. High voltage transformer 111 also includes a winding 42 for developing a retrace pulse signal HOR at the horizontal rate during normal operation of horizontal deflection circuit 122. Additionally, tansformer 111 includes a tertiary winding 43 for producing an ultor voltage U that is coupled to an ultor electrode of CRT 10 of CRT 11 and of CRT 12. Ultor voltage U is also coupled via a voltage divider, not shown to screen electrodes, not shown, of CRT's 10, 11 and 12.

Vertical parabola signal VERT is AC coupled via a capacitor C7 to a cathode of a diode D5 of a fault detector 70. Diode D5 has an anode that is coupled to a DC voltage $V_{REF}$. Consequently, a parabolic voltage VERT1 that is clamped approximately to the level of voltage $V_{REF}$ is developed at the cathode of diode D5. Voltage VERT1 is coupled via a peak rectifier that includes a diode D6 to a noninverting input terminal of a comparator 72. An inverting input terminal of amplifier 72 is coupled to voltage $V_{REF}$. However when signal VERT is generated, indicating normal vertical deflection, an output voltage $V_{72}$ at a magnitude that is greater than $+12$ volts is produced at an output terminal 72a of comparator 72. On the other hand, when vertical deflection loss occurs, voltage $V_{72}$ is approximately zero.

Signal HOR that provides some indication of normal horizontal scanning is coupled via a diode D4 to an emitter electrode of a transistor Q1 of fault detector 70. However, when, due to a fault, one of the horizontal deflection windings is disconnected, signal HOR may still be generated. A capacitor C6 is coupled to the collector of tansistor Q1 and to a noninverting input terminal of a comparator 71. A inverting input terminal of comparator 71 is coupled to reference voltage $V_{REF}$. When signal HOR is produced, that provides some indication of normal horizontal scanning, an output voltage $V_{71}$ developed at an output terminal 71a of comparator 71 is greater than $+12$ volts. On the other hand, when signal HOR is missing, that is indicative of a loss of horizontal scanning, voltage $V_{71}$ is approximately zero volts.

Voltages $V_{71}$ and $V_{72}$ are coupled to base electrodes of a pair of transistors Q2 and Q3, respectively. The emitter electrodes of transistors Q2 and Q3 are coupled together at a junction terminal 70a. Terminal 70a is coupled via a resistor R10 in parallel with a video bypass capacitor to a voltage level $+V_3$ that is $+12$ volts. The collector electrodes of transistors Q2 and Q3 are coupled to ground conductor GND through corresponding arc protection resistors.

In accordance with an aspect of the invention, when any one of connector pairs (P14, Q14), (P15, D15) or (P16, D16) is disengaged, a voltage SWEEP-NORMAL, that is close to zero volts, is developed at terminal 70a. Each of horizontal windings 20, 21 and 22 is coupled to horizontal deflection circuit 122 via the corresponding connector pair that also couples a corresponding one of vertical deflection windings 14, 15 and 16 to a vertical deflection circuit 13. Therefore, if any of connector pairs (P14, Q14), (P15, Q15) or (P16, Q16) is disengaged, resulting in a loss of horizontal deflection, a voltage SWEEP-NORMAL, that is a close to zero volts will be developed at terminal 70a.

The loss of horizontal deflection that occurs because a given one of the connector pairs is disengaged is detected, advantageously, by simply sensing signal VERT that is produced by vertical deflection circuit 13 for developing voltage SWEEP-NORMAL at close to zero volts. Voltage SWEEP-NORMAL, that is close to zero volts, is developed at terminal 70a also when signal HOR is missing or if, for any other reason, vertical deflection current $i_V$ is not produced. During normal operation, voltage SWEEP-NORMAL is at $+12$ volts.

A low level video signal is provided by a source 9 to a kinescope driver statge 55. Source 9 includes, for example, conventional video processing stages of a projection television receiver that receives an input signal from an antenna 8. Stage 55 includes an input, common emitter amplifier transistor 50 arranged in a cascode amplifier configuration with a common base amplifier transistor 51. The video signal produced by source 9 is coupled to the base input of transistor 50. Base voltage for transistor 51 at $+12$ volts is provided through a resistor 25 from voltage SWEEP-NORMAL, during normal deflection operation.

The output circuit of driver stage 55 includes a series arrangement 29 formed by an inductor L1, a diode D10, an inductor L2, a resistor 27 and a resistor 28. Series arrangement 29 forms a collector load at the collector of transistor 51. A high level amplified video signal is developed at the collector of transistor 51. The outut circuit of driver stage 55 also includes opposite conductivity type emitter follower transistors 30 and 81 forming a Class B amplifier with base inputs coupled to the collector of transistor 51. The emitter output of transistor 81 is coupled to the emitter output of transistor 30. The high level amplified video signal is coupled from an emitter output of PNP follower transistor 30 or of NPN follower transistor 81, which corresponds to an output terminal of driver stage 55, to a cathode electrode 56 of image reproducing kinescope or CRT 10 via a kinescope arc current limiting resistor 33. A resistor 34 in the collector circuit of NPN follower transistor 81 also serves as a kinescope arc current limiting resistor. Likewise, a collector resistor 30a of tansistor 30 acts as a kinescope arc current limiting resistor.

Kine supply voltage level $+V_1$ is coupled to a terminal 28a of stage 55, between series arrangement 29 and resistor 34. Voltage level $+V_1$ is coupled to terminal 58a via a resistor R24 that is coupled to a filter capacitor C8 and via a self biasing diode 60. The purpose of diode 60 is described in detail in a copending U.S. patent application Ser. No. 07/516,386, filed concurrently herewith, entitled SELF BIASING PROTECTION ARRANGEMENT FOR A CATHODE RAY TUBE in the name of John Barrett George and incorporated by reference herein, is also provided. An arrangement similar to stage 55, not shown, is provided for each of CRT's 11 and 12.

When, for example, one of the aforementioned connector pairs is disengaged, voltage SWEEP-NORMAL is close to zero volts, as explained before. Voltage SWEEP-NORMAL at close to zero volts causes transistors 51 and 30 to become nonconductive. Assume that voltage level $+V_1$ is produced. Therefore, when transistor 51 becomes nonconductive, a cathode voltage $V_K$ of CRT 10 is maintained at approximately $+225$ volts. A grid voltage $V_G$ that is developed at a grid G1 of CRT 10 is maintained at a voltage that is not more positive than $+27$ volts. The large voltage difference between the cathode and grid of CRT 10 causes a cut-off condition to occur in CRT 10 in which a beam current $i_{BEAM}$ at the cathode of CRT 10 becomes zero. Voltage SWEEP-NORMAL at near zero volts protects CRT 10 against a damage to tis display screen by preventing ultor voltage U from producing beam current $i_{BEAM}$.

A grid biasing and cut-off circuit 777 such as, for example, described in a copending U.S. patent application Ser. No. 07/515,513, filed concurrently herewith, entitled A PROTECTION CIRCUIT FOR A CATHODE RAY TUBE, in the name of John Barrett George and incorporated by reference herein, is also provided. Circuit 777 maintains grid voltage $V_G$ at about $+27$ volts during normal operation and causes voltage $V_G$ to be at about $-200$ volts when signal HOR is not generated. Under various fault conditions circuit 777 provides an additional protection that is capable of blanking CRT 10. For example, if, for some reason, transistor 51 is not maintained disabled throughout an interval that follows horizontal deflection loss and while ultor voltage U is still sufficiently large to produce a beam current, then circuit 777 can prevent screen burn damage in CRT 10 during such interval.

What is claimed is:

1. A video display apparatus comprising:
    a first cathode ray tube having a first deflection yoke mounted thereon that includes a first horizontal deflection winding and a first vertical deflection winding;
    a second cathode ray tube having a second deflection yoke mounted thereon that includes a second horizontal deflection winding and a second vertical deflection winding such that, in normal operation, said vertical deflection windings are coupled in series to form a current path that includes said vertical deflection windings;
    a horizontal deflection circuit output stage for generating a corresponding horizontal deflection current in each of said horizontal deflection windings in normal operation;
    a vertical deflection circuit output stage for generating a vertical deflection current in said current path in normal operation;
    a first connector of a first connector pair having a pair of terminals that are coupled to said first vertical deflection winding and to said first horizontal deflection winding, respectively;
    a second connector of said first connector pair having a pair of terminals that are coupled to said horizontal and to said vertical deflection circuit output stages, respectively, such that when said first connector pair is engaged said horizontal deflection current flows in said first horizontal deflection winding and said vertical deflection current flows in said first vertical deflection winding and when said connector pair is disengaged, each of said horizontal and vertical deflection currents in said first horizontal deflection winding and in said vertical deflection windings, respectively, are not generated; and
    means coupled to said current path that is formed by vertical deflection windings and responsive to said vertical deflection current for generating a control signal that is indicative when said vertical deflection current is generated such that, when said vertical deflection current is not generated, said control signal is indicative of said connector pair being disengaged said control signal being coupled to at least one of said cathode ray tubes for blanking a beam current in said at least one of said cathode ray tubes when said control signal is generated for providing fault protection.

2. An apparatus according to claim 1 wherein said control signal generating means comprises an impedance that is coupled in series with said deflection windings and means responsive to a voltage that is developed in said impedance for generating therefrom said control signal.

3. An apparatus according to claim 2 wherein said impedance comprises at least one of a current sampling resistor and a DC blocking capacitor.

* * * * *